US008405448B2

United States Patent
Hall et al.

(10) Patent No.: US 8,405,448 B2
(45) Date of Patent: Mar. 26, 2013

(54) CAPACITIVE DISCHARGE FUSE PROGRAMMING APPARATUS AND METHOD

(76) Inventors: David R. Hall, Provo, UT (US);
Marshall Soares, Taylorsville, UT (US);
Paul Moody, Sandy, UT (US)

(*) Notice: Subject to any disclaimer, the term of this patent is extended or adjusted under 35 U.S.C. 154(b) by 48 days.

(21) Appl. No.: 13/231,108

(22) Filed: Sep. 13, 2011

(65) Prior Publication Data

US 2012/0313690 A1    Dec. 13, 2012

Related U.S. Application Data

(60) Provisional application No. 61/495,863, filed on Jun. 10, 2011, provisional application No. 61/496,550, filed on Jun. 13, 2011.

(51) Int. Cl.
*H01H 37/76* (2006.01)
(52) U.S. Cl. ...................................... 327/525; 365/225.7
(58) Field of Classification Search .......... 327/525–526; 365/225.7
See application file for complete search history.

(56) References Cited

U.S. PATENT DOCUMENTS

| | | | | |
|---|---|---|---|---|
| 3,191,151 A * | 6/1965 | Price | ................................ | 365/96 |
| 4,225,878 A * | 9/1980 | Dobkin | ......................... | 257/530 |
| 4,412,241 A * | 10/1983 | Nelson | ........................... | 257/529 |
| 4,777,471 A * | 10/1988 | Comer | ............................ | 341/118 |
| 5,394,032 A * | 2/1995 | Conzelmann et al. | .......... | 326/38 |
| 6,674,316 B2 * | 1/2004 | Romas, Jr. et al. | ............ | 327/308 |
| 2002/0003447 A1 * | 1/2002 | Nagase et al. | ................. | 327/530 |
| 2012/0176180 A1 * | 7/2012 | Saed et al. | ..................... | 327/525 |

* cited by examiner

*Primary Examiner* — Thomas J Hiltunen
(74) *Attorney, Agent, or Firm* — Philip W. Townsend, III

(57) ABSTRACT

An apparatus for programming a fuse includes a programmable branch comprising a fusable element and a reverse-biased diode connected in series. The programmable branch is connected in parallel with a current boost capacitor. An electrical source or input supplies a current that is sufficient to charge the current boost capacitor to a breakdown voltage of the reverse-biased diode and subsequently melt the reverse-biased diode. Melting the reverse-biased diode may induce a reduction in voltage across the current boost capacitor and result in a current surge through the programmable branch that is sufficient to program (i.e. blow) the fusable element. A corresponding method for programming a fuse is also disclosed.

20 Claims, 6 Drawing Sheets ent and filed on 10 Jun.
CAPACITIVE DISCHARGE FUSE PROGRAMMING APPARATUS AND METHOD

RELATED APPLICATIONS

This application claims the benefit of U.S. Provisional Application 61/495,863 entitled "Fuse" and filed on 10 Jun. 2011 by Marshall Soares and Paul Moody and to U.S. Provisional Application 61/496,550 entitled "OTP ROM Programmable Devices" filed on 13 Jun. 2011 by Marshall Soares and Paul Moody. Each of the aforementioned Applications are incorporated herein in their entirety.

BACKGROUND OF THE INVENTION

The ability to practically and reliably program fuses used in programmable devices and trimmable circuits is often limited by the amount of current that is locally available to program (i.e. blow) such fuses. Due to cohesion forces, programmed fuses may eventually bridge the gap created in the fuse during programming particularly in high temperature environments. The ability to provide a high instantaneous current during programming in conjunction with pre-heating of a fusable element could provide programmable circuits that are more reliable and able to withstand high temperature environments.

BRIEF SUMMARY OF THE INVENTION

The present invention has been developed in response to the present state of the art, and in particular, in response to the problems and needs in the art that have not yet been fully solved by currently available fuse programming apparatii and methods. Accordingly, the present invention has been developed to provide a fuse programming apparatus and method that overcomes shortcomings in the art.

As detailed below, an apparatus for programming a fuse includes a programmable branch comprising a fusable element electrically connected in series with a reverse-biased diode. The programmable branch is connected in parallel with a current boost capacitor. An electrical source or input supplies a current to the current boost capacitor and the programmable branch that is sufficient to charge the current boost capacitor to a breakdown voltage of the reverse-biased diode and subsequently melt the reverse-biased diode and thereby induce a reduction in voltage across the current boost capacitor. In response to the reduction in voltage, the current boost capacitor provides a current surge through the programmable branch that is sufficient to blow the fusable element. A corresponding method for programming a fuse is also disclosed.

It should be noted that references throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

The described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

DETAILED DESCRIPTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of components and materials to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring certain aspects of the invention.

Figure 1:
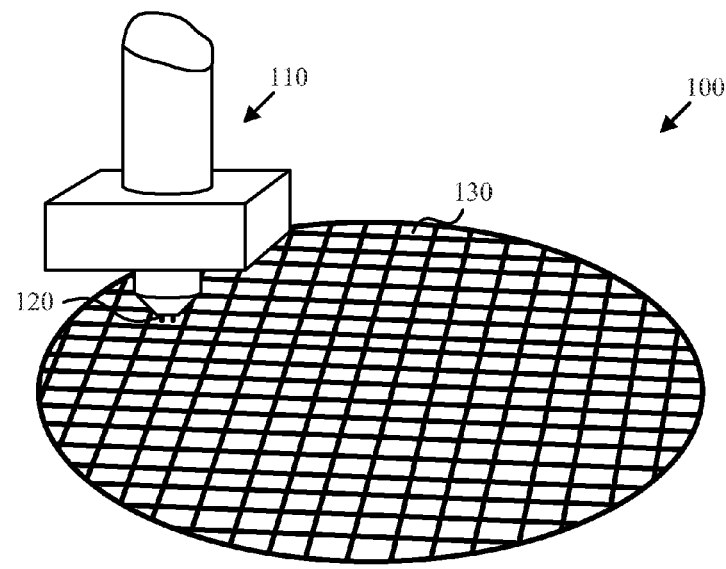
FIG. 1 is a perspective view illustration of one environment wherein the present invention may be utilized.

FIG. 1 is a perspective view illustration of an integrated circuit programming environment 100 wherein the present invention may be utilized. As depicted, the integrated circuit programming environment 100 includes a programming head 110 with probes 120. The programming head 110 may be positioned over integrated circuits 130 on a wafer 140 and lowered to make contact between the probes 120 and contact pads (not shown) on a particular integrated circuit 130. Electrical signals may be applied to the probes 120 to program (i.e. blow) fusable elements on the integrated circuit 130. In such a manner the integrated circuits 130 may be programmed or trimmed to perform a desired function.

Figure 2:
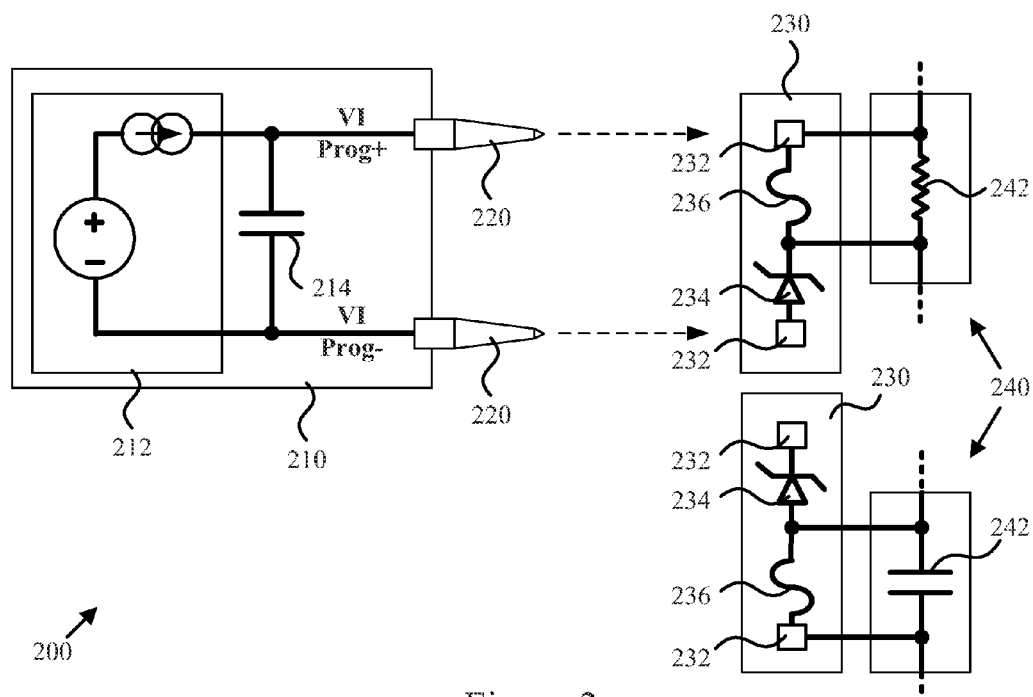
FIG. 2 is a schematic block diagram of a fuse programming apparatus that is consistent with one or more embodiments of the present invention.

FIG. 2 is a schematic block diagram of a fuse programming apparatus 200 that is consistent with one or more embodiments of the present invention. As depicted, the fuse programming apparatus 200 includes a programming module 210 with a pair of programming probes 220, a programmable branch 230 with programming pads 232, and a trimmable or programmable circuit 240. The programming apparatus 200 facilitates programming or trimming of the circuit 240 and provides a programmed fuse with superior reliability and programming control over prior art programmed fuses.

The programming module 210 includes an electrical source 212 and a current boost capacitor 214. The current boost capacitor 214 stores charge for providing a surge in current to the programmable branch 230. The depicted programmable branch 230 is electrically connected in parallel with the current boost capacitor 214 via the probes 220 and includes the programming pads 232 electrically connected in series with a reverse-biased diode 234 and a fusable element 236.

The programming pads 232 are used to provide physical contact with and electrical connectivity to the programming probes 220. The reverse-biased diode 234 may be a diode or the like with a reverse-biased breakdown voltage that is greater than a forward-biased voltage drop across the diode 234. The ability to impose a relatively high reverse-biased voltage across the diode 234 may enable the apparatus 200 to store significantly more charge on the current boost capacitor 214 and improve the quality of a programmed fusable element 236.

The trimmable or programmable circuit 240 may be any circuit that may benefit from having the programmable branch 230 attached thereto in order to shunt or expose one or more circuit elements 242 connected in parallel with the fusable element 236 depending on whether the fusable element 236 is in an unprogrammed (i.e. unblown) or programmed (i.e. blown) state. In one embodiment, the circuit 240 is a programmable logic device. In another embodiment, the circuit 240 is a trimmable circuit such as a gain circuit or an oscillator circuit.

Figure 3:
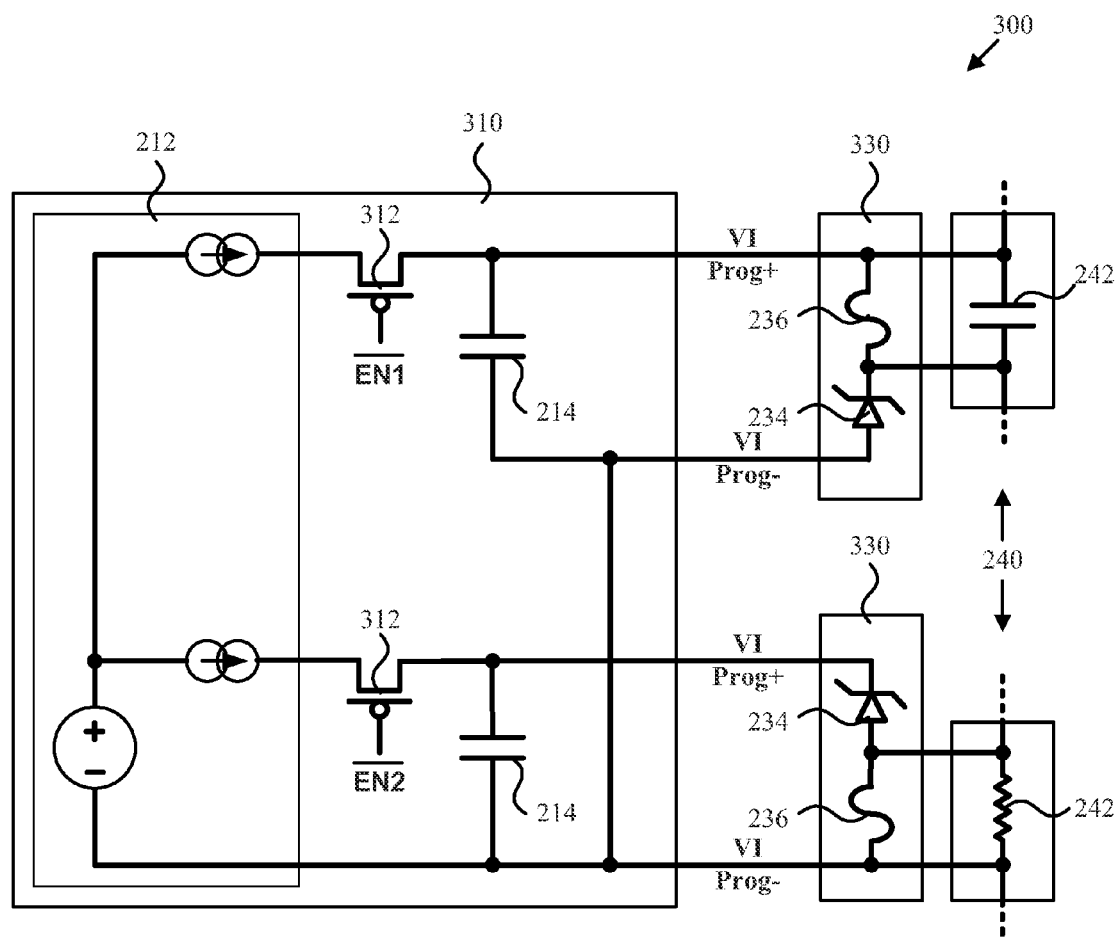
FIG. 3 is a schematic block diagram of an integrated circuit fuse programming apparatus that is consistent with one or more embodiments of the present invention.

FIG. 3 is a schematic block diagram of an integrated circuit fuse programming apparatus 300 that is consistent with one or more embodiments of the present invention. As depicted, the integrated circuit fuse programming apparatus 300 includes a programming module 310, a programmable branch 330, and the trimmable or programmable circuit 240. Similar to the programming apparatus 200, the programming apparatus 300 provides a programmable fuse with superior reliability over prior art fuses. However, while the programming apparatus 200 may be partially embodied within an external programming head or the like, the programming apparatus 300 is depicted to be wholly embodied within an integrated circuit (not shown) and thereby facilitate internally generated programming/trimming of the trimmable or programmable circuit 240.

Similar to the programming module 210, the programming module 310 may include one or more electrical sources 212 and current boost capacitors 214. The programming module 310 may also include one or more enable gates 312 that facilitate selection of a particular branch 330 for programming. In contrast to the programmable branch 230, the programmable branch 330 may omit the programming pads 232 while including the reverse-biased diode 234 and the fusable element 236.

Within the fuse programming apparatus 200 and 300, the voltage and current supplied by electrical sources 212 is preferably sufficient to charge the current boost capacitor to a breakdown voltage of the reverse-biased diode. Since the stored energy on a capacitor is proportional to the voltage squared, charging the current boost capacitor to a reverse-biased breakdown voltage significantly increases the amount of energy available for blowing the fusable element 236 relative to a forward-biased voltage drop.

In addition to, and possibly subsequent to, charging the current boost capacitor, the current supplied by the electrical sources 212 is preferably sufficient to melt the reverse-biased diode and thereby induce a reduction in voltage across the current boost capacitor. The melting may be due to heating of the reversed-biased diode beyond a melting temperature of the diode material. For example, a silicon diode has a melting temperature of ~1400 degrees Celsius. In response to the reduction in voltage, the current boost capacitor may provide a current surge through the programmable branch that is sufficient to blow the fusable element 236. The current surge may result in quicker and more complete destruction of the fusable element 236 resulting in a blown fuse that is less vulnerable to regrowth and bridging particularly at high temperatures. Using a current surge may also facilitate the use of lower resistance and/or higher temperature materials in the fusable element 236 and more precise trimming for the trimmable circuit 240.

Figure 4:
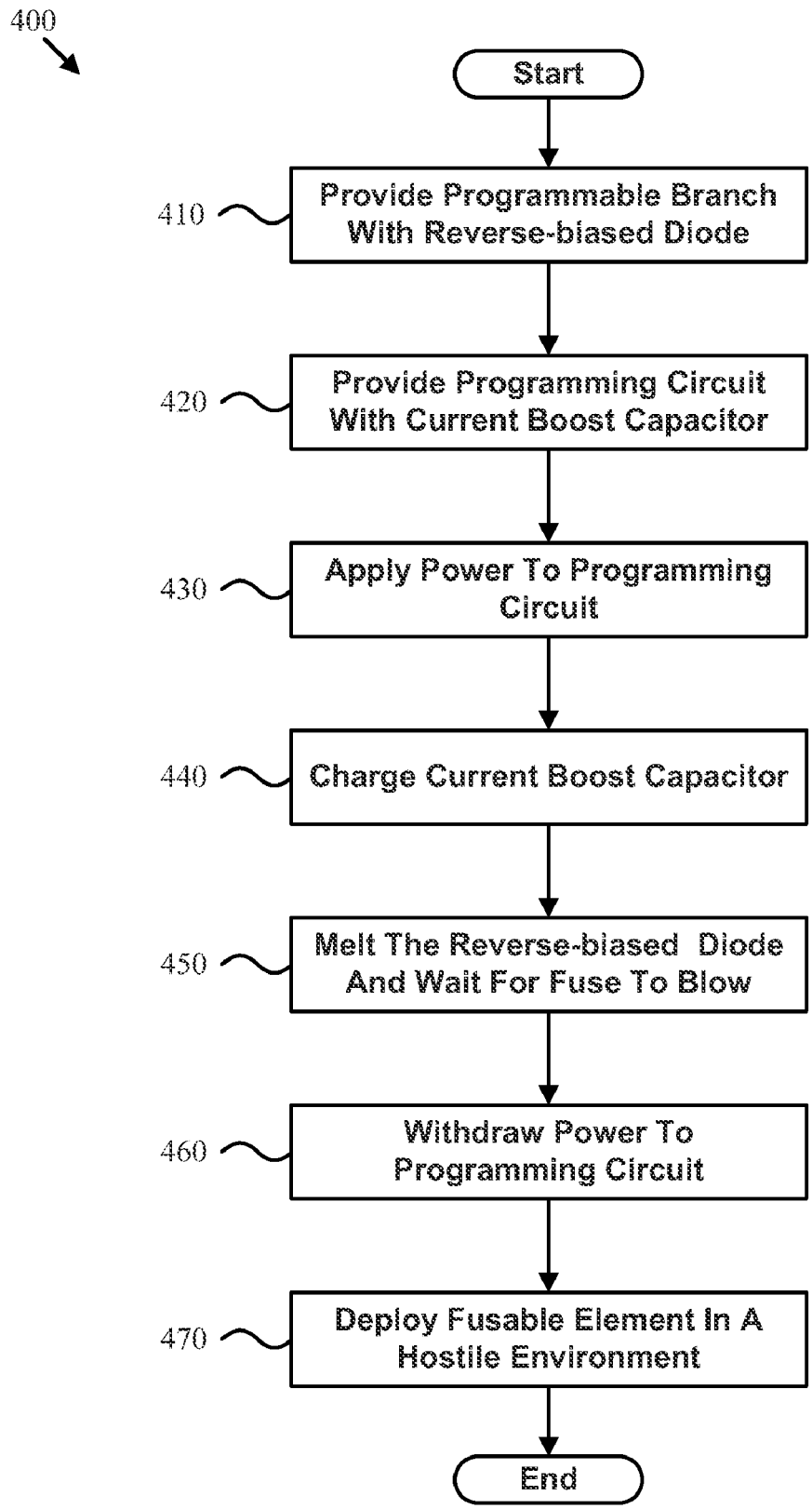
FIG. 4 is a flowchart diagram of a fuse programming method that is consistent with one or more embodiments of the present invention.

FIG. 4 is a flowchart diagram of a fuse programming method 400 that is consistent with one or more embodiments of the present invention. As depicted, the fuse programming method 400 includes providing 410 a programmable branch with a reverse-biased diode, providing 420 a programming circuit with a current boost capacitor, applying 430 power to the programming circuit, charging 440 the current boost capacitor, melting 450 the reverse-biased diode, withdrawing power 460 and deploying 470 the programmable branch. The fuse programming method 400 facilitates creating blown fuses with superior reliability attributes.

Providing 410 a programmable branch with a reverse-biased diode may include providing a branch comprising a fusable element in series with the reverse-biased diode. Providing 420 a programming circuit with a current boost capacitor may include providing a circuit with a current boost capacitor that is connected to, or connectable to, an electrical source. The current boost capacitor may be connected in parallel with the programmable branch. Applying 430 power to the programming circuit may include activating or connecting to the electrical source.

Charging 440 the current boost capacitor may include sourcing sufficient current and/or voltage from the electrical source to attain a voltage on the current boost capacitor that exceeds the breakdown voltage of the diode. Melting 450 the reverse-biased diode may include providing current from the electrical source that is sufficient to melt the reverse-biased diode typically after the breakdown voltage has been achieved. Melting the reverse-biased diode may induce a reduction in the voltage across the programmable branch. The reduction in voltage may be due to changes in the physical properties of the diode that result from melting. In response thereto, the current boost capacitor may provide a current surge through the programmable branch that is sufficient to blow the fusable element.

Figure 5:
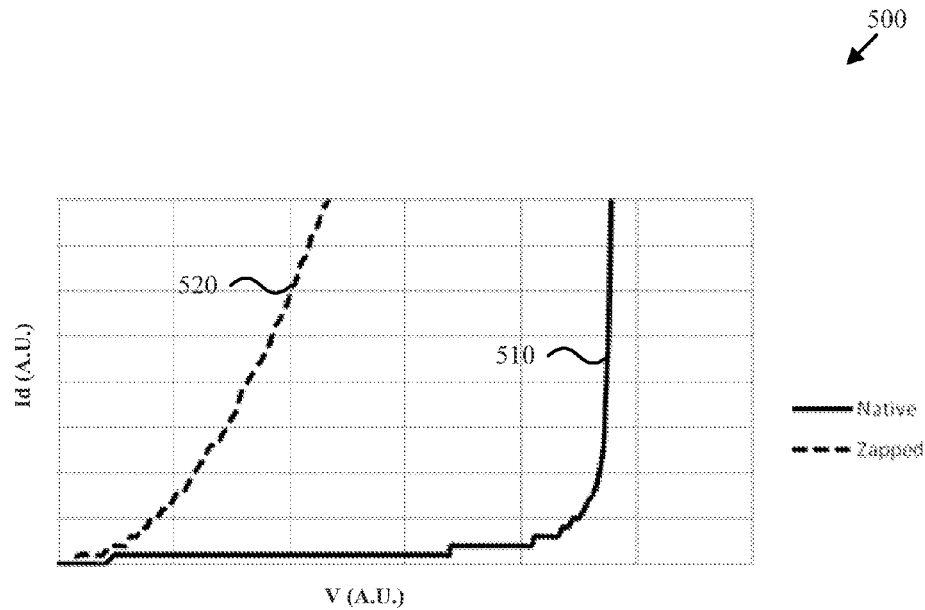
FIG. 5 is a response graph for a reverse-biased diode that is consistent with various embodiments of the present invention.

Withdrawing 460 power to the programming circuit may include de-activating or disconnecting the electrical source. Deploying 470 the fusable element may include deploying a circuit that incorporates the fuseable element in a hostile environment with elevated temperatures and accelerations. For example, the hostile environment may be a downhole environment where temperatures exceed 300° C. and accelerations exceed 200 gs. The downhole environment may include oil and gas drilling, exploration drilling, geothermal drilling, mineral drilling, or combinations thereof. Other hostile environments may include rocket or engine applications. Further, oven applications may include hostile environments. Other hostile environment may include mining applications, excavation environments, FIG. 5 is a response graph 500 for a reverse-biased diode that is consistent with various embodiments of the present invention. As depicted, the response graph 500 includes a pre-programmed response curve 510 and a post-programmed response curve 520. The graph 500 indicates that melting or 'zapping' the reverse-biased diode changes the exponential breakdown response to a non-linear resistance response. One of skill in the art will appreciate that the reduction in the voltage associated with 'zapping' the diode would result in a surge in current from the current boost capacitor.

It should also be noted that diode may be immediately adjacent to the fusable element and that melting or 'zapping' the reverse-biased diode may pre-heat the fusable element 236 and thereby improve the effectiveness of the current surge in blowing fusable element 236. Consequently, the current surge combined with the elevated temperature due to pre-heating of the fusable element may result in a more reliable programmed fuse.

Figure 6:
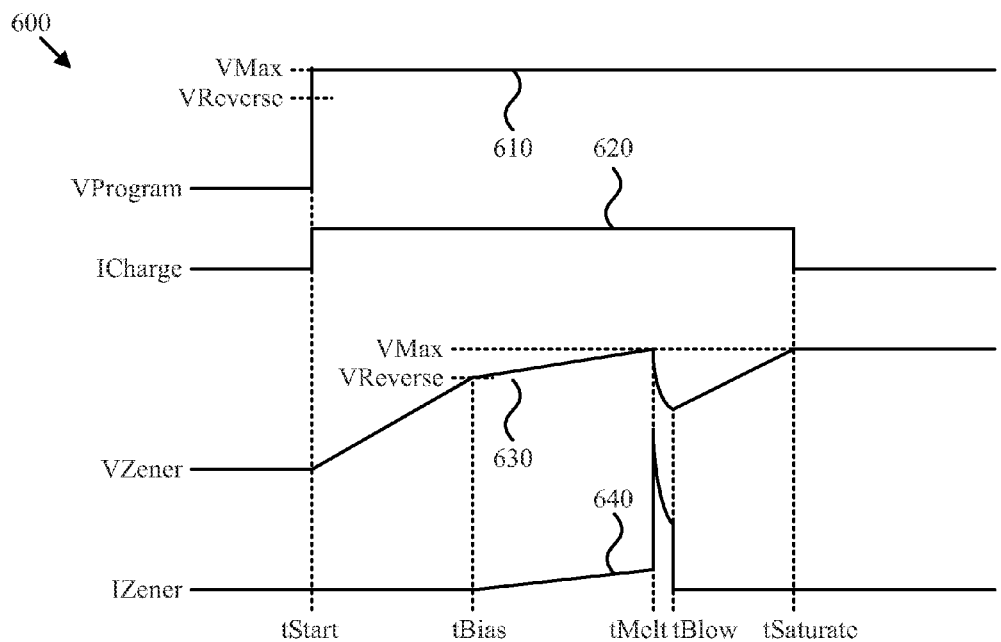
FIG. 6 is a timing diagram that is consistent with various embodiments of the present invention.

FIG. 6 is a timing diagram 600 that is consistent with various embodiments of the present invention. The timing diagram 600 illustrates the temporal interactions between a programming signal 610, a charging current 620, a biasing voltage 630, and a biasing current 640. In certain embodiments, the programming signal 610 and charging current 620 are provided by or occur within the electrical source 212. The biasing voltage 630 and biasing current 640 may be associated with the reverse-biased diode 234. One of skill in the art will appreciate that the timing diagram 600 is presented in an idealized form in order to convey the basic concepts associated with the present invention and is not intended to be definitive or prescriptive.

The programming signal 610 may be activated at a start time 'tStart'. The programming signal is preferably greater than the reverse-bias voltage of the diode 234. In the depicted embodiment, the programming signal is set at a maximum voltage associated with the electrical source.

Activation of the programming signal may result in a current flow for the charging current 620. The charging current 620 may charge the current boost capacitor 214 and increase the biasing voltage 630 until the reverse-biased voltage (a.k.a. breakdown voltage) is attained at a time 'tBias'. In response to attaining the breakdown voltage, the biasing current 640 may be activated and heat up the diode 234 until the reverse-biased diode essentially melts at a melt time 'tMelt'. Melting the diode 234 may induce a drop in the biasing voltage 630 and a surge in the biasing current 640. The surge in the biasing current 640 may blow the fusable element 236 in a manner that is superior to conventional techniques.

In many embodiments, the drop in the biasing voltage 630 occurs for less than one microsecond and the surge in the biasing current 640 is greater than 100 mA. In some embodiments, the reduction in voltage occurs in less than 100 nanoseconds and the surge in the biasing current 640 is greater than 500 mA. One of skill in the art will appreciate that the attainable currents are dependent on the materials and processing techniques used to fabricate the fuse programming apparatus as well as the particular circuit design for the fuse programming apparatus.

Figure 7:
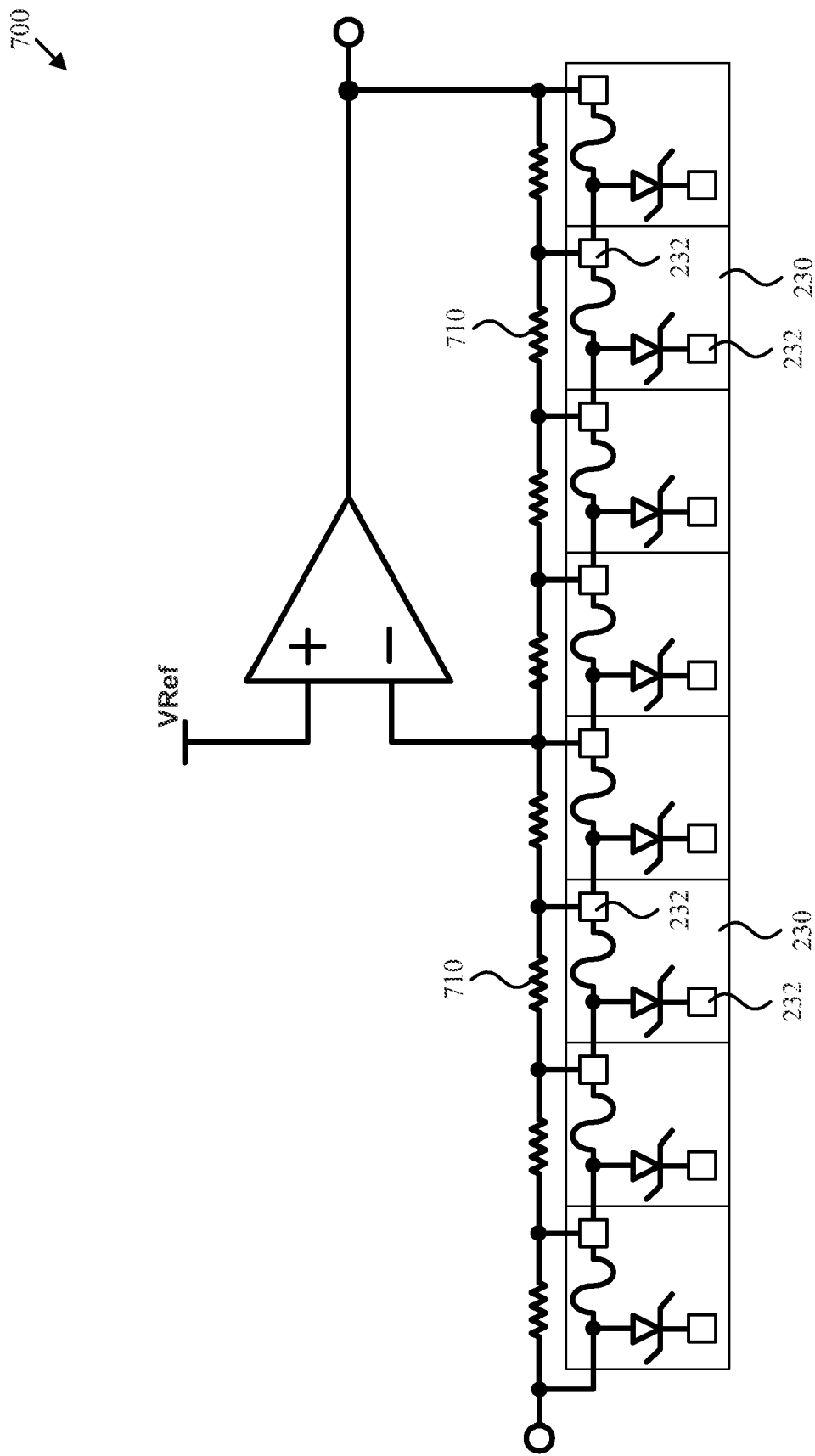
FIG. 7 is a schematic block diagram of a wafer programmed circuit that is consistent with one or more embodiments of the present invention.

FIG. 7 is a schematic block diagram of a wafer programmed circuit 700 that is consistent with one or more embodiments of the present invention. As depicted, the wafer programmed circuit 700 includes a number of programming branches 230 with programming pads 232 electrically connected in series with the reverse-biased diode 234 and the fusable element 236. Each programmable branch 230 enables an external programming head such as the programming head 110 to optionally expose a trimming resistor 710 and thereby trim the wafer programmed circuit 700.

Figure 8:
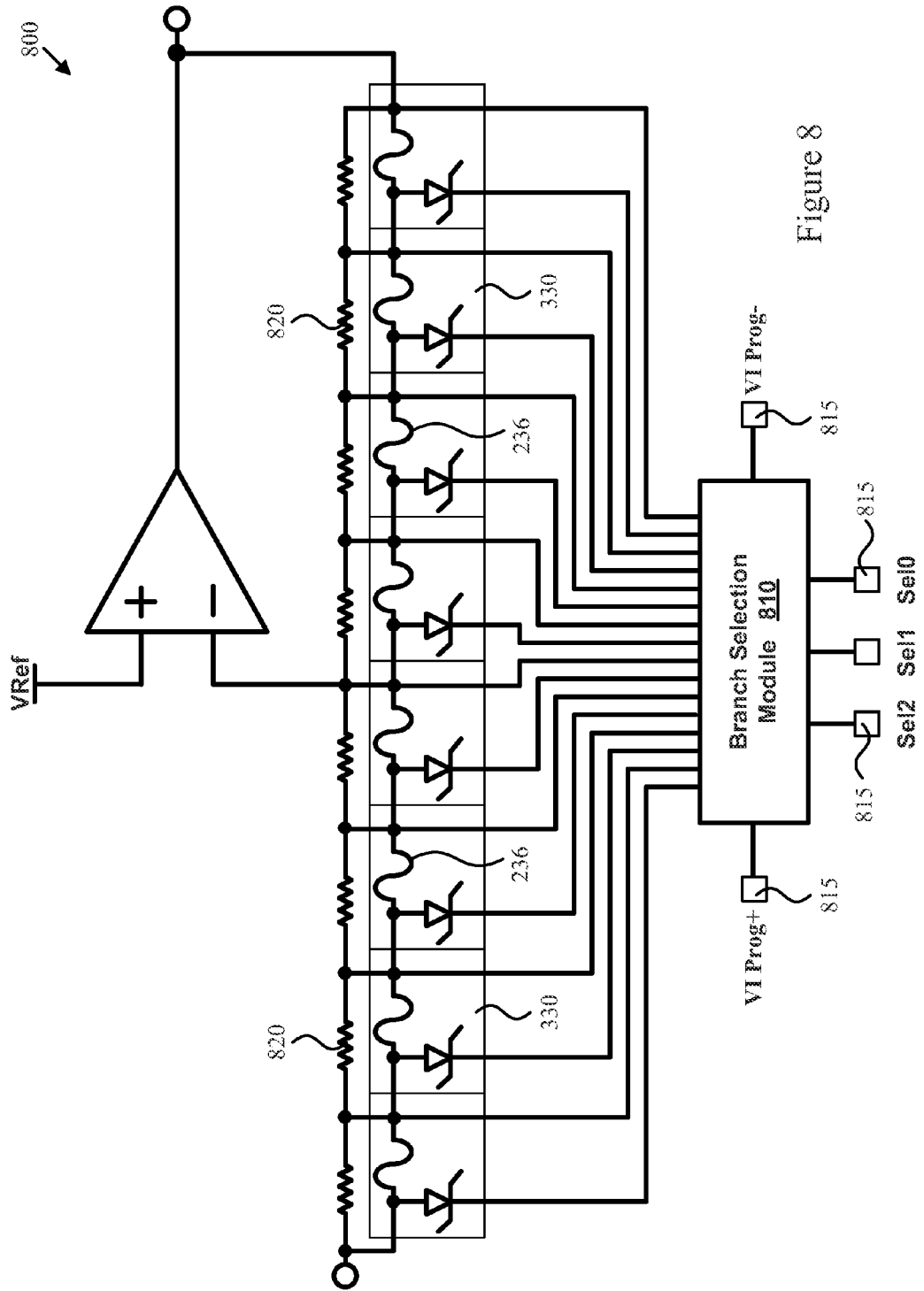
FIG. 8 is a schematic block diagram of a field programmable circuit that is consistent with one or more embodiments of the present invention.

FIG. 8 is a schematic block diagram of a field programmable circuit 800 that is consistent with one or more embodiments of the present invention. Instead of programming pads for each programmable branch, a branch selection module 810 connects one or more programming pins 815 to a selected programmable branch. In one embodiment, the fuse selection module 810 includes one or more current boost capacitors 214. In another embodiment, an external programming unit contains the current boost capacitor 214. By selecting a particular programmable branch 330 with the fuse selection module 810 (via the programming pins 815) and blowing the shunting fuse 236 associated with the programmable branch, the trimming resistor 820 associated with the selected programmable branch may be unshunted and exposed to the field programmable circuit 800.

Whereas the present invention has been described in particular relation to the drawings attached hereto, it should be understood that other and further modifications apart from those shown or suggested herein, may be made within the scope and spirit of the claims.

What is claimed is:

1. An apparatus for programming a fuse, the apparatus comprising:
   a programmable branch comprising a fusable element electrically connected in series with a reverse-biased diode;
   a current boost capacitor for storing charge, the current boost capacitor electrically connected in parallel with the programmable branch, the current boost capacitor configured to receive current and store charge at least to a breakdown voltage of the reverse-biased diode;
   at least one electrical input for providing a current to the current boost capacitor and the programmable branch that is sufficient to charge the current boost capacitor to a breakdown voltage of the reverse-biased diode and melt the reverse-biased diode and thereby induce a reduction in voltage across the current boost capacitor;
   the current boost capacitor further configured to provide a current surge through the programmable branch in response to a reduction in voltage across the current boost capacitor; and
   wherein the current surge is sufficient to program the fusable element.

2. The apparatus of claim 1, wherein the fusable element is immediately adjacent to the reverse-biased diode to enable pre-heating of the fusable element.

3. The apparatus of claim 1, further comprising a first and second electrical probe electrically connected to opposing ends of the current boost capacitor and a first and second programming pad electrically connected to opposing ends of the programmable branch such that electrical connectivity is provided between the programmable branch and the current boost capacitor when the first and second electrical probes are in contact with the first and second programming pads, respectively.

4. The apparatus of claim 1, further comprising at least one circuit element connected in parallel with the fusable element.

5. The apparatus of claim 4, wherein the at least one circuit element comprises a programmable logic circuit.

6. The apparatus of claim 4, wherein the at least one circuit element comprises a trimmable circuit.

7. The apparatus of claim 1, further comprising an electrical source for providing the current to the current boost capacitor and the programmable branch.

8. The apparatus of claim 7, wherein the electrical source is selected from the group consisting of a current source and a voltage source with a non-zero internal resistance.

9. The apparatus of claim 1, wherein the reduction in voltage occurs in less than one microsecond.

10. The apparatus of claim 1, wherein the reduction in voltage occurs in less than one hundred nanoseconds.

11. The apparatus of claim 1, wherein the current surge is greater than 100 mA.

12. The apparatus of claim 1, wherein the reduction in voltage occurs in less than 100 nanoseconds.

13. A method for programming a fuse, the method comprising:
   providing a programming circuit comprising a programmable branch connected in parallel with a current boost capacitor, the current boost capacitor configured to provide a current surge in response to a reduction in voltage across the current boost capacitor, the programmable branch comprising a fusable element electrically connected in series with a reverse-biased diode;
   supplying a current to the current boost capacitor and the programmable branch that is sufficient to charge the current boost capacitor to a breakdown voltage of the reverse-biased diode and subsequently melt the reverse-biased diode and thereby induce a reduction in voltage across the current boost capacitor and thereby induce the current surge from the current boost capacitor; and
   wherein the current surge is sufficient to program the fusable element.

14. The method of claim 13, further comprising pre-heating the fusable element in conjunction with melting the reverse-biased diode.

15. The method of claim 13, further comprising programming a circuit connected in parallel with the fusable element.

16. The method of claim 15, further comprising deploying the circuit and the fusable element in an environment where temperatures exceed 300° C. and accelerations exceed 200 g's.

17. The method of claim 16, wherein the hostile environment is a jackbit environment.

18. The method of claim 13, further comprising trimming a circuit connected in parallel with the fusable element.

19. The method of claim 13, wherein the reduction in voltage occurs in less than one microsecond.

20. The method of claim 13, wherein the current surge is greater than 100 mA.

* * * * *